(12) United States Patent
Tian

(10) Patent No.: US 6,327,689 B1
(45) Date of Patent: Dec. 4, 2001

(54) ECC SCHEME FOR WIRELESS DIGITAL AUDIO SIGNAL TRANSMISSION

(75) Inventor: Wenshun Tian, Singapore (SG)

(73) Assignee: Cirrus Logic, Inc., Austin, TX (US)

(*) Notice: Subject to any disclaimer, the term of this patent is extended or adjusted under 35 U.S.C. 154(b) by 0 days.

(21) Appl. No.: 09/298,449

(22) Filed: Apr. 23, 1999

(51) Int. Cl.[7] ........................................ G06F 11/10
(52) U.S. Cl. ............................ 714/751; 714/756
(58) Field of Search ........................ 714/751, 756, 714/752, 746, 761

(56) References Cited

U.S. PATENT DOCUMENTS

| | | | |
|---|---|---|---|
| 4,829,525 | * 5/1989 | Sugiyama et al. | 714/761 |
| 5,412,638 | 5/1995 | Koulopoulos et al. | 369/59 |
| 5,673,363 | 9/1997 | Jeon et al. | 395/2.79 |
| 5,742,644 | 4/1998 | Campana, Jr. | 375/316 |
| 5,745,532 | 4/1998 | Campana, Jr. | 375/347 |
| 5,745,582 | 4/1998 | Shimpuku et al. | 381/77 |

* cited by examiner

Primary Examiner—Phung M. Chung
(74) Attorney, Agent, or Firm—Goerge O. Saile & Assoc.

(57) ABSTRACT

In this invention digital audio data transmitted by wireless means is error corrected and concealed to remove and hide noise created errors ranging from random to burst noise. The data is interleaved into even and odd sub-frames to combat burst mode noise, and ECC is created for the MSB of the data and for command and control bytes using a Reed Solomon encoder before transmission. The LSB are not encoded for reasons of bandwidth because experiments have show the LSB have little effect on audible noise even at a bit error rate of 3.0E-3. The transmitted data is decoded using Reed Solomon decoder and error corrected. The digital audio data is then processed through a concealment procedure that hides the remaining MSB errors by using extrapolation, soft muting and muting depending on the state of audio data preceding and following the current sub-frame of the digital audio data. Soft muting is a form of windowing using Hanning or other windowing algorithms where the coefficients of the window algorithm diminish to a minimum at the boundaries of the data frames.

26 Claims, 5 Drawing Sheets

ECC SCHEME FOR WIRELESS DIGITAL AUDIO SIGNAL TRANSMISSION

BACKGROUND OF THE INVENTION

1. Field of Invention

This invention relates in general to error correction and error concealment of digital data and in particular error correction and concealment for the wireless transmission of digital audio data.

2. Description of Related Art

In a noisy environment digital audio signals transmitted by means of wireless transmission can become corrupted and produce a noticeable audible noise. When the bit error rate of the audio signals approaches 3.0E-3, the audio signals can become quite distorted by the noise. Both random noise and burst noise can corrupt a wireless transmission and a method is needed to provide a way to remove the noise from the audio signal. This could take the form of error correction, and in cases where the noise errors are too many to correct, a form of hiding or concealing of the noise is needed. When noise errors are hidden, the method used needs to be such that the area of concealment is smoothed so as not to cause distortions that result in audible perturbations.

In U.S. Pat. No. 5,745,582 (Shimpuku et al.) a method and a system is disclosed to transmit and receive a digital audio signal with ECC by means of an optical transmission. In U.S. Pat. No. 5,745,532 (Campana, Jr.) a system and method is disclosed for digital wireless data which uses dual data streams delayed in time from one another to provide replacement data to the stream which has an uncorrectable error. In U.S. Pat. No. 5,742,644 (Campana, Jr.) reconstruction and re-synchronization are done for wireless serial transmissions where fading causes uncorrectable errors beyond the correction capability of ECC. In U.S. Pat. No. 5,673,363 (Jeon et al.) a method for error concealment is described where frequency components, in the last segments of a frame where an error does not occur, are used to reconstruct the frequency components of subsequent frames that are in error. In U.S. Pat. No. 5,412,638 (Koulopoulos et al.) an error correcting scheme for a digitized audio output of a CD player is described using a finite impulse response filter.

The wireless transmission of digital audio data exposes the data to corruption by noise that is random and noise that occurs in bursts. When bit error rates of the transmitted data are low (<<3.0E-3), the need for error correction ranges from not being needed to being satisfied by well known error correction techniques. However, as the bit error rate approaches 1.0E-3 to 3.0E-3 or higher, more of the transmitted digital audio data will be found to be corrupted and will require means for concealment of the corrupted data that exceeds the limit of the capability of ECC (error correction code).

SUMMARY OF THE INVENTION

In this invention an error correction scheme is described for wireless transmission of digital audio data. The scheme encompasses interleaving the data to combat burst noise, encoding the data to produce ECC bytes, transmitting the data in a serial first in first out fashion, receiving the transmitted data, decoding the data with ECC bytes, applying error correction and concealment techniques to hide errors that cannot be corrected and re-establishing the digital audio data to its original form A subsystem is provided for transmitting wireless digital audio data including formatting the data for error correction and avoidance, encoding ECC and transmitting the data in a first in first out serial sequence. A subsystem for receiving the wireless digital audio data is provided which includes receiving the transmitted data, decoding the error correction portion of the data, error correcting the data, concealing errors which cannot be error corrected, and reformatting of the digital audio data back into its original form.

The digital audio data to be sent by the transmitting subsystem is interleaved by formatting the data into a sub-frame containing even numbered bytes and a sub-frame containing odd numbered bytes. The interleaving of data into even and odd bytes between sub-frames is done to combat burst errors and distribute the burst noise so that it may be more easily corrected or concealed. The even and odd sub-frames are further organized into least significant bytes (LSB) and most significant bytes (MSB). The MSB of each sub-frame are protected by error correction codes (ECC) using Reed-Solomon or equivalent encoders. Although, the LSB could be protected, they are left unprotected to save bandwidth because experiments have shown little effect to audible noise even at a bit error rate BER= 3.0E-3. The sub-frames containing the digital audio data and including ECC bytes are transmitted wireless in a first in, first out sequence.

The wireless transmitted even and odd sub-frames of the digital audio data are received by the receiving subsystem and the MSB of both sub-frames including the ECC are fed through a Reed Solomon decoder, or equivalent. Those bytes of the data that can be error corrected are corrected using the ECC and the remainder of any erroneous bytes that cannot be corrected are hidden by concealment techniques. When a sub-frame is corrupted beyond ECC correction, the lost information can be recovered by interpolation based on the other sub-frame. If more than two frames are corrupted, soft-muting is applied. Soft-muting is an application of "windowing" which as used here is a method by which a signal in the time domain is truncated, and where the truncation produces as few ripples as possible in the frequency domain, yet maintaining as rectangular a shape as possible in the time domain. The windowing function could be Hanning, Triangle or any other type function in which the weight of the window coefficients approaches zero from the center to the end of the window. When both sub-frames of a current decoded frame cannot be corrected by ECC then the current decoded frame is muted and the previous frame is soft muted. If the next subsequent frame is error free either by no errors occurring or through an ECC correction, then the subsequent decoded frame is soft muted. Once the MSB of the data are processed through correction and concealment, the digital audio data is recombined into its original format and outputted from the receiver subsystem.

BRIEF DESCRIPTION OF THE DRAWINGS

This invention will be described with reference to the accompanying drawings, wherein.

DETAILED DESCRIPTION OF THE PREFERRED EMBODIMENT

Figure 1:
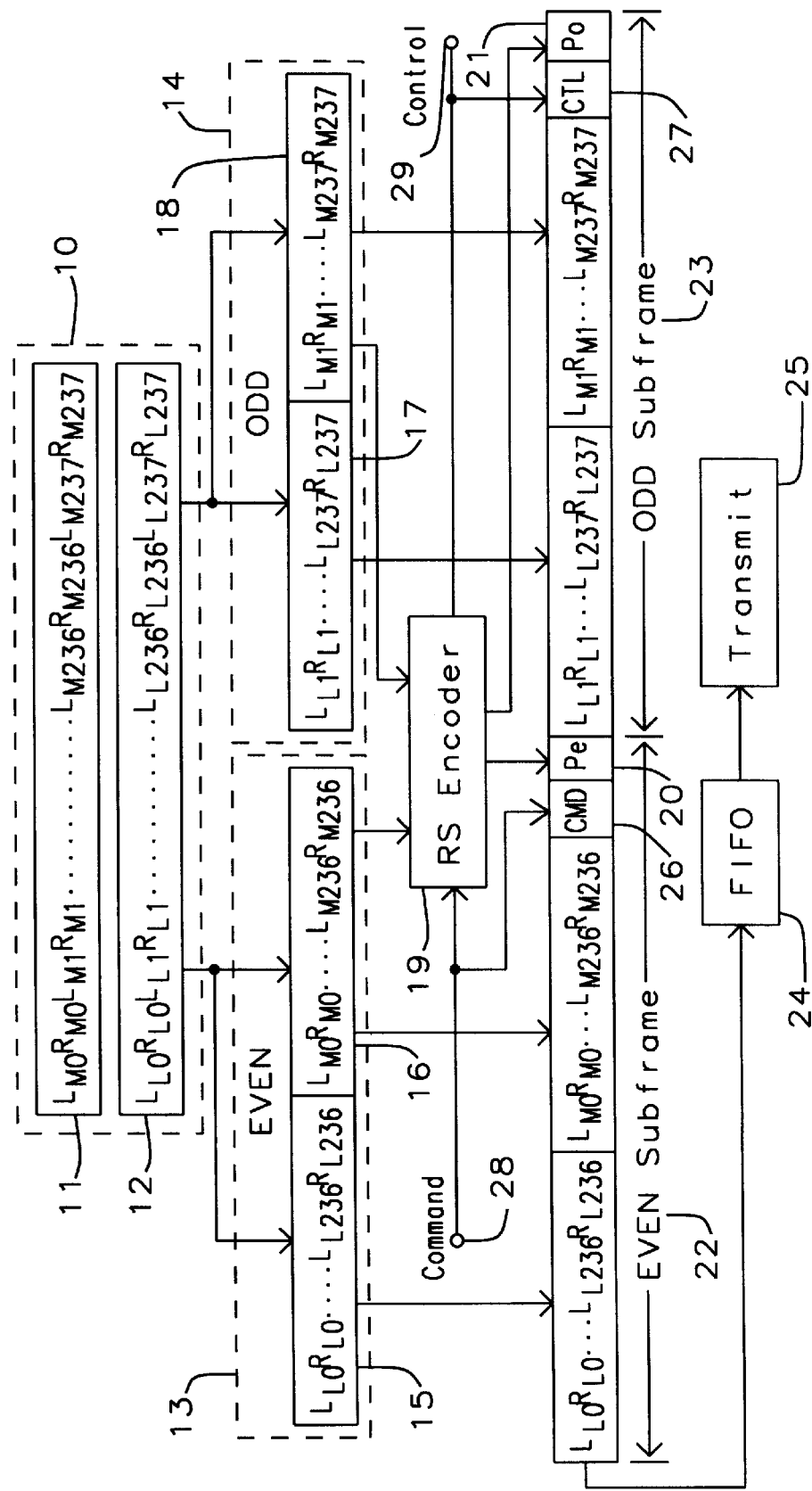
FIG. 1 is a block diagram for encoding and transmitting digital audio data.

FIG. 1 shows a frame 10 of digital audio data that is organized into most significant bytes (MSB) 11 and least significant bytes (LSB) 12. Individual bytes of digital audio data is shown as $L_{M0}$ to $L_{M237}$, $L_{L0}$ to $L_{L237}$, $R_{M0}$ to $R_{M237}$, and $R_{L0}$ to $R_{L237}$ where "L" represents the left source of the audio data and "R" represents the right source of the audio data that is to be transmitted. The subscript "M" represents the MSB and the subscript "L" represents the LSB. The subscript numbers, ranging from "0" to "237" are the position location of the byte of the left or right source of the audio data. There are "238" MSB of left source audio data (L), "238" MSB of right source audio data (R) and an equal number of LSB of audio data for left and right source data.

Continuing to refer to FIG. 1, the frame 10 of audio data is reorganized into two sub-frames, an even sub-frame 13 and an odd sub-frame 14. The even sub-frame 13 contains even bytes of audio data as represented by least significant bytes $L_{L0}$ to $L_{236}$ and $R_{L0}$ to $R_{L236}$, and most significant bytes $L_{M0}$ to $L_{M236}$ and $R_{M0}$ to $R_{M236}$. The odd sub-frame 14 contains odd bytes of audio data as represented by least significant bytes $L_{L1}$ to $L_{L237}$ and $R_{L1}$ to $R_{L237}$, and most significant bytes $L_{M1}$ to $L_{M237}$ and $R_{M1}$ to $R_{M237}$. The even sub-frame 13 is further organized into least significant bytes 15, $L_{L0}$ and $R_{L0}$ to $L_{236}$ and $R_{L236}$, and most significant bytes 16, $L_{M0}$ and $R_{M0}$ to $L_{M236}$ and $R_{M236}$. The odd sub-frame 14 is further organized into least significant bytes 17, $L_{L1}$ and $R_{L1}$ to $L_{L237}$ and $R_{L237}$, and most significant bytes 18, $L_{M1}$ and $R_{M1}$ to $L_{M237}$ and $R_{M237}$ Continuing to refer to FIG. 1, the even most significant bytes 16 and the odd most significant bytes 18 are encoded using a Reed-Solomon encoder 19 to produce two ECC parity codes, Pe 20 and Po 21. The least significant data 15 and 17 were not encoded as a result of experiments which show little audible noise being demonstrated by not error correcting and concealing the LSB. The least significant data could be encoded for error correction and concealment but this would result in a loss in bandwidth. The even digital audio data 13 is transferred to the even sub-frame 22 along with a command byte CMD 26 and the ECC parity code Pe 20 created by the RS encoder 19 for the even most significant bytes 16. The odd digital audio data 14 is transferred to the odd sub-frame 23 along with a control byte CTL 27 and the odd ECC parity code Po 21 created by the RS encoder 19 for the odd most significant bytes 18. The even 22 and odd 23 sub-frames are processed in a first in first out (FIFO) 24 fashion and transmitted 25 by means of a wireless transmission.

Figure 2:
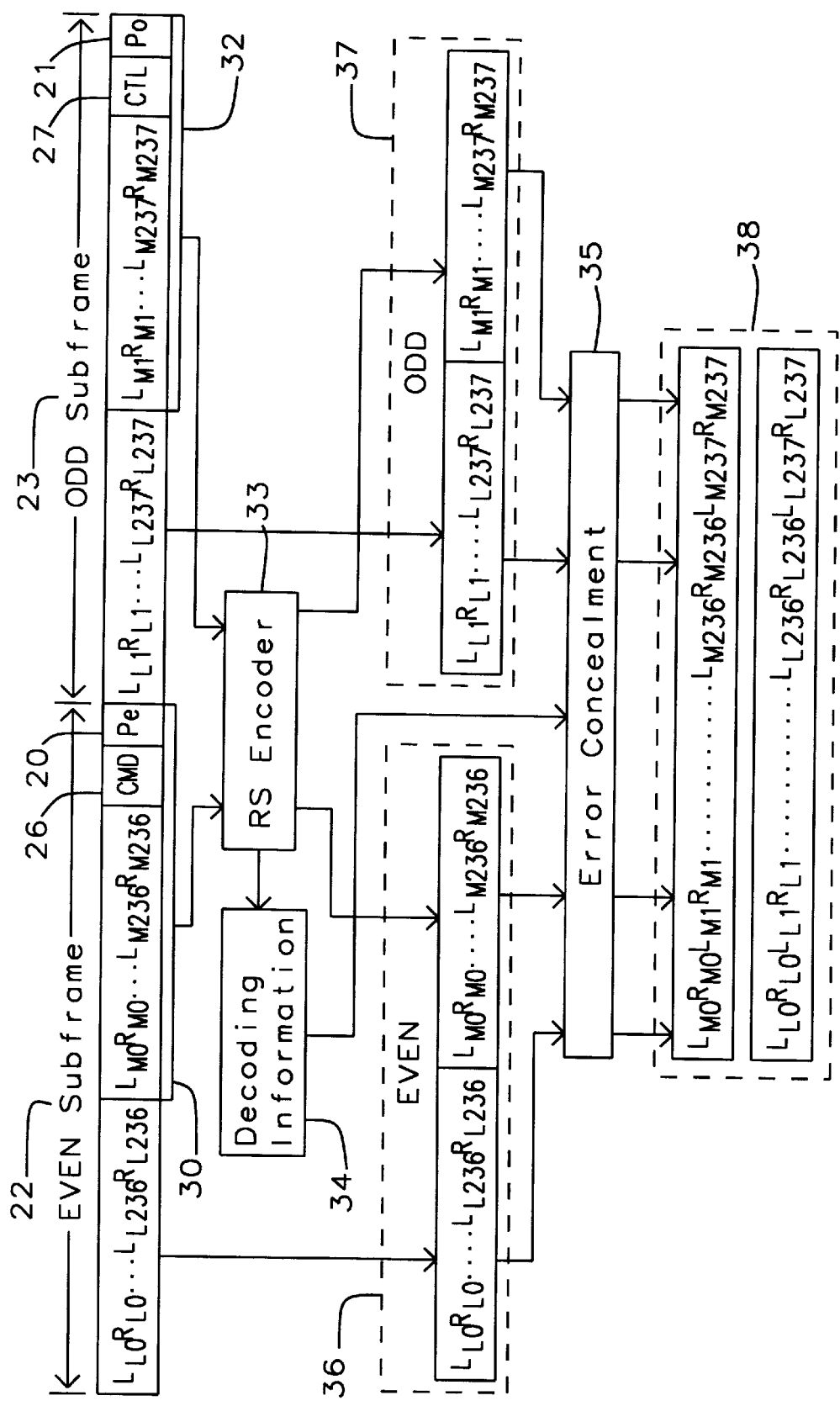
FIG. 2 is a block diagram for receiving, decoding and error correcting and concealment of digital audio data.

In FIG. 2 is shown the receiver for the wireless transmitted digital audio signals. The even 22 and odd 23 sub-frames are shown as received by the receiver subsystem. The least significant bytes, $L_{L0}$ and $R_{L0}$ to $L_{236}$ and $R_{L236}$, of the even sub-frame 22 are transferred directly to the output even sub-frame 36, and the least significant bytes, $L_{L1}$ and $R_{L1}$ to $L_{L237}$ and $R_{L237}$ of the odd sub-frame 23 are transferred directly to the output odd sub-frame 37. The most significant bytes 30, $L_{M0}$ and $R_{M0}$ to $L_{M236}$ and $R_{M236'}$, of the even sub-frame 22 are connected to the RS decoder 33, including the command byte CMD 26 and the ECC parity code Pe 20 for the even most significant bytes of digital audio data. The most significant bytes 32, $L_{M1}$ and $R_{M1}$ to $L_{M237}$ and $R_{M237}$, of the odd sub-frame 23 are connected to the RS decoder 33, including the control byte CTL 27 and the ECC parity code Po 21 for the odd most significant bytes of digital audio data.

Continuing to refer to FIG. 2, the RS decoder decodes the ECC information contained within Pe 20 and Po 21 to determine errors located in the most significant bytes, $L_{M0}$ and $R_{M0}$ to $L_{M236}$ and $R_{M236'}$, of the even sub-frame 30, and to determine errors located in the most significant bytes, $L_{M1}$ and $R_{M1}$ to $L_{M237}$ and $R_{M237}$, of the odd sub-frame 32. Errors that are within the limit of the correction capability of the RS decoder 33 are corrected. The most significant bytes 30 and 32 of the even sub-frame 22 and odd sub-frame 23 are connected to error concealment 35 along with decoding information 34 after corrections are made by the RS decoder 33. The decoding information 34 points to sub-frames with no errors, including those corrected by the RS decoder, and points to sub-frames with multiple errors that could not be corrected by the RS decoder 33. Error concealment 35 hides the erroneous bytes not corrected by the RS decoder 33 by using techniques extrapolation, soft muting and muting to smooth the resulting data so as to minimize any additional perturbations to the digital audio data. When erroneous bytes cannot be corrected by the RS decoder the entire sub-frame including the least significant bytes are concealed.

Continuing to refer to FIG. 2, the even MSB of error corrected data, $L_{M0}$ and $R_{M0}$ to $L_{M236}$ and $R_{M236}$, are connected to the even sub-frame 36 by the RS decoder 33. The odd MSB of error corrected data, $L_{M1}$ and $R_{M1}$ to $L_{M237}$ and $R_{M237}$, are connected to the odd sub-frame 37 by the RS decoder 33. The even and odd sub-frames 36 and 37 are passed through error concealment 35 which uses decoding information 34 to select data to be hidden that could not be corrected by the RS decoder 33. The sub-frames are recombined into a frame 38 of digital audio data which reforms the received data into the original format of the data that was inputted to the transmitter as shown in FIG. 1.

Figure 3:
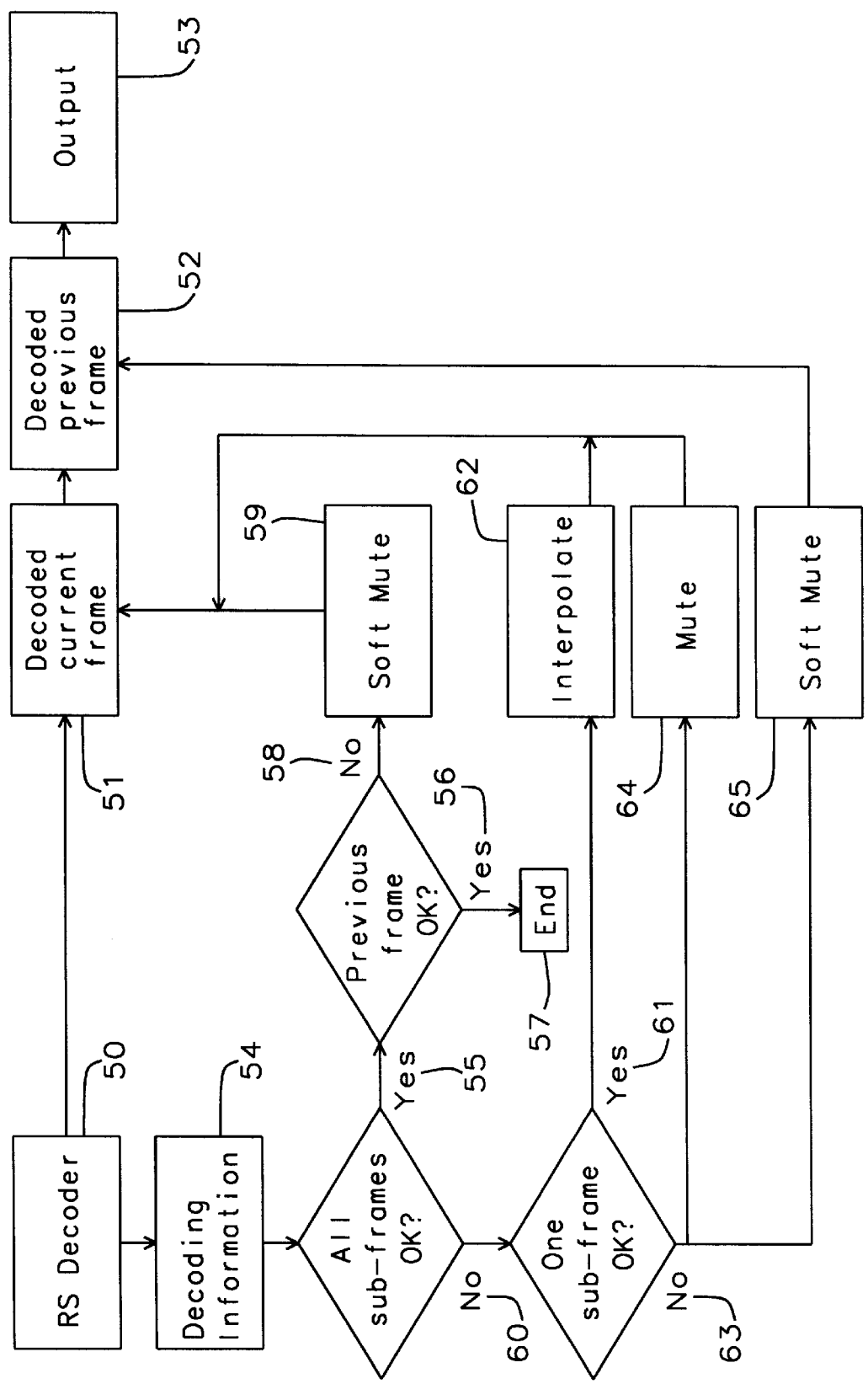
FIG. 3 is a block diagram for error concealment.

In FIG. 3 is shown the process for concealment. There are two outputs from the RS decoder 50, the decoded current frame 51 and decoding information 54. The decoded previous frame 52 is held until the concealment process is completed for the current frame 51 to allow the completion of the process for the current frame. The decoding information 54 identifies sub-frames that have transmission errors that cannot be corrected using ECC. If all sub-frames in the decoded current frame are OK (do not contain any uncorrectable error) 55 and the previous frame is OK (does not contain any uncorrectable error) 56, the concealment process is ended 57. With the ending of the concealment process the decoded previous frame 52 is outputted 53 from the error correction and concealment process, the decoded current frame 51 is moved to the decoded previous frame 52, and the next frame in the sequence of frames that has not been decoded is decoded and becomes the decoded current frame 51.

Figure 4:
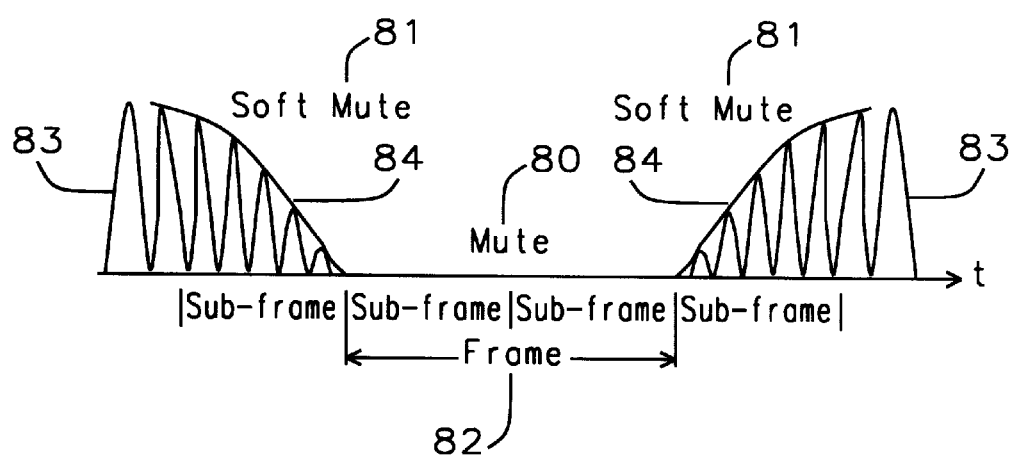
FIG. 4 is a graph of the error concealment using muting and soft muting.

Continuing to refer to FIG. 3, if all sub-frames of the current frame 55 are "OK" (do not contain any uncorrectable error) 55, but the previous frame has errors that are not corrected 58, then the current frame is soft muted 59 using a Hanning window, or similar windowing function, that has coefficients that are weighted such as to provide a maximum signal in the middle of the current frame and diminish toward zero at the edge of the frame, similar to the diagram shown in FIG. 4. If all sub-frames are not "OK" 60 but one sub-frame is without errors 61, then the corrupted sub-frame of the decoded current frame 51 is interpolated 62 from the sub-frame with good data. If both sub-frames are corrupted 63, then the decoded current frame 51 is muted 64, and the decoded previous frame 52 is soft muted 65. Once the processing of the decoded previous frame 52 and the decoded current frame is completed, the decoded previous frame 52 is outputted 53 from the receiver, the decoded current frame becomes the decoded previous frame 52 and a new decoded current frame 51 is created by the RS decoder 50.

Referring to FIG. 4, several sub-frames of digital audio data are shown after concealment using mute 80 and soft mute 81. A frame 82 is corrupted and was muted by the concealment process. The digital audio data 83 in the adjacent frames was good and was soft muted 81 to smooth the transition between the good data and the muted bad data. The envelope 84 of the soft mute 81 represents a convolution with a Hanning window where weight of the window coefficients approaches zero from the center to the end of the window as shown in FIG. 4. This allows a maximum value of the digital data near the center of the frame preceding and the frame following the muted frame 82, and approaches zero near the muted frame. Other windows can be used such as Triangular and Hamming and could be chosen based upon the ripple effect beyond the main lobe in the frequency domain, among other factors. The Hanning window perhaps produces the smoothest time domain cutoff, having the fewest frequency domain ripples and being one of the easiest to apply.

Figure 5:
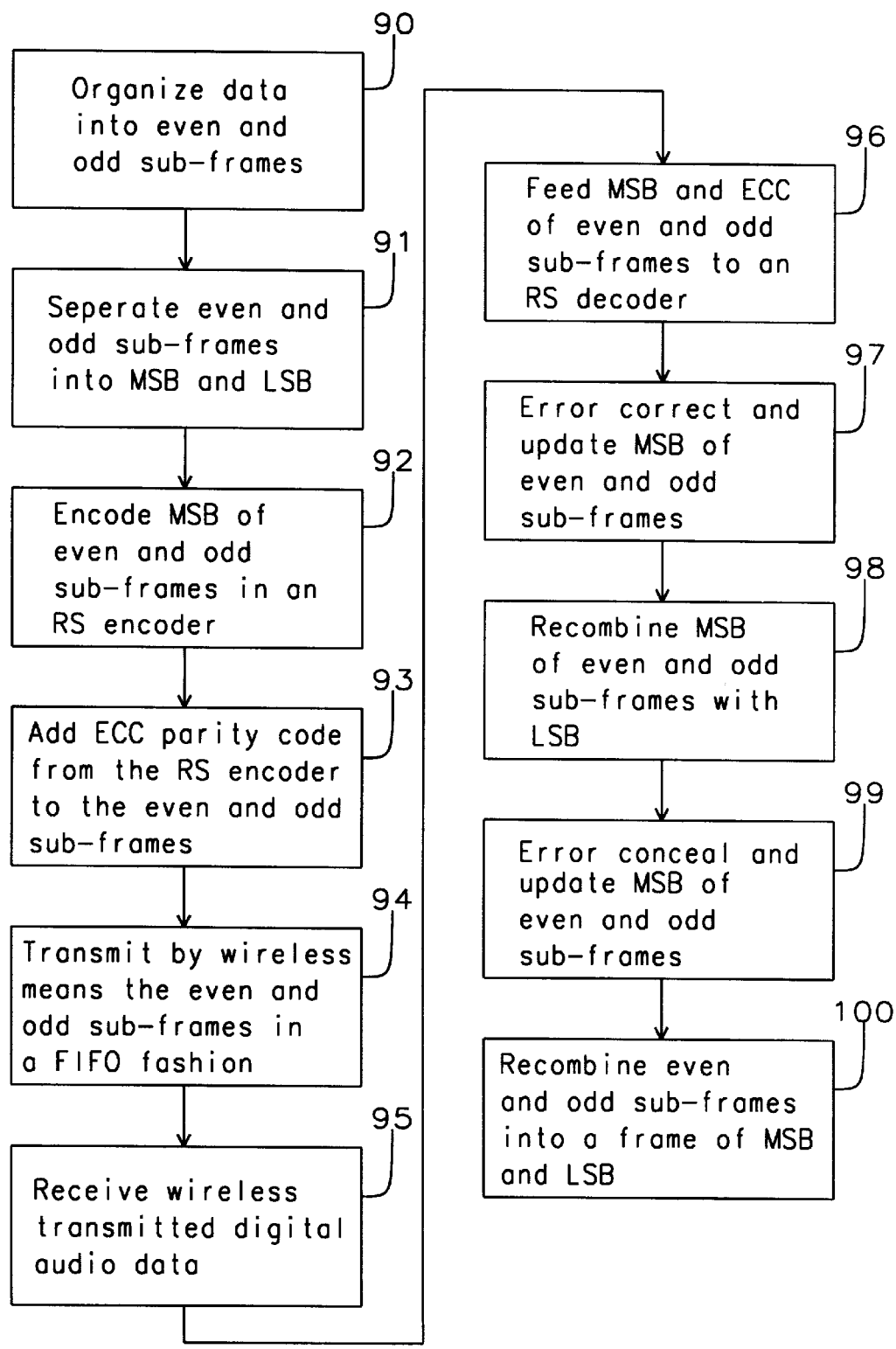
FIG. 5 is a block diagram of the method of error correction and concealment of wireless transmitted digital audio data.

Referring to FIG. 5, a method is shown for error correcting and concealing of digital audio data that is transmitted by wireless means. Digital audio data is organized into even and odd sub-frames 90, where the even sub-frames contain even numbered bytes of left and right audio sources, and the odd sub-frames contain odd numbered bytes of left and right audio sources. The organization of the data into even and odd sub-frames interleaves the data and helps combat noise bursts. The even and odd sub-frames are further separated into most significant bytes (MSB) and least significant bytes (LSB) 91. The MSB of the even and odd sub-frames are encoded with an RS encoder to create error correction code (ECC) for each sub-frame 92. The ECC is added to the even and odd sub-frames 93 along with a command CMD byte added to the even sub-frame and a control CTL byte added to the odd sub-frame. The even and odd sub-frames with ECC are transmitted by wireless means in a first in, first out (FIFO) fashion 94. The wireless transmitted digital audio data is received 95 from the transmitting subsystem. The MSB and ECC of the received even and odd sub-frames are fed to an RS decoder 96. The MSB of the even and odd sub-frames are updated by the RS decoder with error corrected data 97 using the transmitted ECC. The MSB, including updates from the error corrected data, are recombined with the LSB in the even and odd sub-frames 98. Errors within the even and odd sub-frames which cannot be corrected are updated with error concealment 99 using concealment techniques comprising extrapolation, muting and soft muting. When the MSB of a sub-frame has been determined to be uncorrectable, the LSB of that sub-frame is also defined as uncorrectable and the sub-frame is labeled as corrupted. If one of the two sub-frames contain valid data, the corrupted data is recovered by interpolation from the sub-frame that is not corrupted and both the MSB and LSB of the corrupted sub-frame are updated with recovered data. If both sub-frames are corrupted, the MSB and LSB of both corrupted sub-frames are muted and the sub-frames surrounding the corrupted sub-frames are soft muted. The even and odd sub-frames of the updated MSB and the LSB are recombined into a frame of MSB and LSB data 100 with a structure identical to that of the original data imputed to the transmitter.

While the invention has been particularly shown and described with reference to preferred embodiments thereof, it will be understood by those skilled in the art that various changes in form and details may be made without departing from the spirit and scope of the invention.

What is claimed is:

1. A system for wireless transmission and reception of digital audio data, comprising:
   a) a transmitter for wireless transmission of digital audio data,
   b) said digital audio data interleaved into even and odd numbered sub-frames,
   c) said transmitter sends by means of a wireless transmission data comprising digital audio data, ECC (error correction code), command data and control data,
   d) a receiver receives the wireless transmission of said data, and
   e) said receiver performs error recovery and error concealment to correct errors created in the wireless transmission of said data.

2. The system of claim 1, wherein even sub-frames contain MSB (most significant bytes) and LSB (least significant bytes) of even numbered data and odd sub frames contain MSB and LSB of odd numbered data.

3. The system of claim 1, wherein said ECC is created for data comprising MSB of said digital audio data, the command data and the control data.

4. The system of claim 1, wherein error concealment is performed on data that is unrecoverable using ECC means.

5. The system of claim 4, wherein said error concealment uses extrapolation when only one sub-frame of an even and odd pair of sub-frames is valid.

6. The system of claim 4, wherein said error concealment uses muting and soft muting both even and odd sub-frames are recoverable.

7. A system for error correction and concealment for wireless transmission and reception of digital audio data, comprising:
   a) a transmitter and receiver for wireless transmission and reception of digital audio data,
   b) said digital audio data connected to said transmitter is contained in a frame form containing most significant bytes and least significant bytes,
   c) said frame broken into sub-frames for sending by wireless transmission,
   d) said sub-frame comprising a first sub-frame with even numbered bytes of digital audio data, and a second sub-frame with odd numbered bytes of digital audio data,
   e) said transmitter creates ECC for data to be transmitted comprising command and control bytes and the most significant bytes of said first sub-frame and of said second sub-frame,
   f) said transmitter transmits said data and said ECC to said receiver in a first in first out sequence of sub-frames,
   g) said receiver receives the first and the second sub-frames and decodes the most significant bytes with said ECC to correct errors caused in transmission,
   h) said receiver hides errors not corrected with ECC using error concealment, and
   i) said receiver recombines said digital audio data including any error corrected and error concealed data into said frame form.

8. The system of claim 7, wherein ECC is performed on least significant bytes of the digital audio data.

9. The system of claim 7, wherein error concealment comprises data interpolation, muting and soft muting.

10. The system of claim 7, wherein the ECC is created in the transmitter using a Reed Solomon encoder and decode in the receiver using a Reed Solomon decoder.

11. The system of claim 7, wherein interleaving of odd and even sub-frames is used to combat burst errors.

12. A method of error concealment for digital audio data, comprising:
   a) decoding a current frame of digital audio data,
   b) processing a next frame of digital audio data when sub-frames of said current frame are good and a previous frame is good
   c) soft muting said current frame when sub-frames are good and said previous frame was not good,
   d) interpolating said current frame when only one sub-frame of said current frame is good,
   e) muting said current frame and soft muting said previous frame when both sub-frames are not good, and
   f) processing said next frame.

13. The method of claim 12, wherein soft muting is an application of windowing which could be Hanning, Triangle or other window functions in which the weight of the window coefficients approach zero from the center to the end of the window.

14. The method of claim 12, wherein a Reed Solomon decoder is used to decode most significant bytes of said sub-frame of said current frame.

15. A digital audio data transmission subsystem for including error correction code (ECC), comprising:
   a) a frame of digital audio data divided into even and odd sub-frames,
   b) said sub-frames further subdivided into most significant bytes and least significant bytes,
   c) said even sub-frames containing even least significant bytes and even most significant bytes,
   d) said odd sub-frames containing odd least significant bytes and odd most significant bytes,
   e) said even most significant bytes and said odd most significant bytes encoded to produce an ECC code added to said even and odd sub-frames, and
   f) said even and odd sub-frames transmitted in a first in first out fashion.

16. The digital audio data transmission subsystem of claim 15, wherein said even most significant bytes and said odd most significant bytes are encoded using a Reed Solomon encoder.

17. The digital audio data transmission subsystem of claim 15, wherein the least significant bytes are encoded to produce said ECC code.

18. The digital audio data transmission subsystem of claim 15, wherein the data transmission is wireless.

19. The method of claim 18, wherein error concealment is done to said sub-frame in which the MSB could not be error corrected by the RS-decoder.

20. The digital audio data transmission subsystem of claim 15, wherein said ECC is used to combat random and burst noise during transmission.

21. A digital audio data receiving subsystem for including error correction to produce error concealment, comprising:
   a) digital audio data received in sub-frames containing even and odd bytes of digital audio data,
   b) said even sub-frames containing even least significant bytes of audio data ,even most significant bytes of audio data and even sub-frame ECC,
   c) said odd sub-frames containing odd least significant bytes of audio data ,odd most significant bytes of audio data and odd sub-frame ECC,
   d) said even and said odd most significant bytes along with said even and said odd sub-frame ECC combined in a decoder to produce error corrected even and odd sub-frames of digital audio data,
   e) said even and odd sub-frames processed through error concealment to hide errors not caught by ECC, and
   f) said even and odd sub-frames recombined into a frame of most significant digital audio data and least significant digital audio data.

22. The digital audio data receiving subsystem of claim 21, wherein said even most significant bytes and said odd most significant bytes along with even sub-frame ECC and odd sub-frame ECC are decoded using a Reed Solomon decoder.

23. The digital audio data receiving subsystem of claim 21, wherein the digital audio data was received by means of wireless transmission.

24. The digital audio data receiving subsystem of claim 21, wherein error concealment is used to combat random and burst noise during data transmission.

25. A method for error correcting and error concealing of digital audio data transmitted by wireless means, comprising:
   a) organizing digital audio data into even and odd sub-frames,
   b) separating said even and odd sub-frames into most significant bytes (MSB) and least significant bytes (LSB),
   c) encoding said MSB of said even and odd sub-frames with an RS encoder,
   d) adding error correction code (ECC) from said RS encoder to said even and odd sub-frames,
   e) transmitting said even and odd sub-frames with ECC by wireless means,
   f) receiving transmitted even and odd sub-frames,
   g) feeding MSB and ECC of said transmitted even and odd sub-frames to an RS decoder,
   h) error correcting and updating of said MSB of said transmitted even and odd sub-frames using an RS-decoder,
   i) combining said MSB processed through error correction and error concealment with LSB of said transmitted even and odd sub-frames, and
   j) error concealing and updating of said MSB of said transmitted even and odd sub-frames,
   k) recombining even and odd sub-frames into a frame of MSB and LSB of digital audio data.

26. The method of claim 25, wherein organizing digital audio data into even and odd sub-frame is used to combat noise bursts.

* * * * *